United States Patent
Feng et al.

(10) Patent No.: US 11,676,541 B2
(45) Date of Patent: Jun. 13, 2023

(54) SHIFT REGISTER UNIT, GATE DRIVING CIRCUIT, DISPLAY DEVICE, AND METHOD FOR CONTROLLING SHIFT REGISTER UNIT

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP GO., LTD., Beijing (CN)

( * ) Notice: Subject to any disclaimer, the term of this patent is extended or adjusted under 35 U.S.C. 154(b) by 0 days.

(21) Appl. No.: 17/264,050

(22) PCT Filed: Jun. 12, 2020

(86) PCT No.: PCT/CN2020/095752
§ 371 (c)(1),
(2) Date: Jan. 28, 2021

(87) PCT Pub. No.: WO2020/259319
PCT Pub. Date: Dec. 30, 2020

(65) Prior Publication Data
US 2021/0287611 A1 Sep. 16, 2021

(30) Foreign Application Priority Data
Jun. 25, 2019 (CN) .......................... 201910554376.X

(51) Int. Cl.
G09G 3/32 (2016.01)
G09G 3/3266 (2016.01)
(Continued)

(52) U.S. Cl.
CPC ......... *G09G 3/3266* (2013.01); *G09G 3/3225* (2013.01); *G11C 19/28* (2013.01);
(Continued)

(58) Field of Classification Search
CPC ............. G09G 3/3266; G09G 2300/04; G09G 2310/0286; G09G 2310/08; G09G 3/3225; G09G 3/3674; G09G 3/367; G11C 19/28
See application file for complete search history.

(56) References Cited

U.S. PATENT DOCUMENTS 10,825,371 B2   11/2020   Huang
11,263,942 B2   3/2022    Feng et al.
(Continued)

FOREIGN PATENT DOCUMENTS

CN   101765876 A   6/2010
CN   106601181 A   4/2017
(Continued)

OTHER PUBLICATIONS

First Office Action (dated Dec. 20, 2022) of the corresponding CN201910554376.X with Search Report.

*Primary Examiner* — Roy P Rabindranath
(74) *Attorney, Agent, or Firm* — Chiwin Law LLC

(57) ABSTRACT

The present disclosure provides a shift resister unit, a gate driving circuit, a display device, and a method for controlling a shift register unit. The shift register unit incudes a first input sub-circuit, a first output sub-circuit, a first reset sub-circuit, a second input sub-circuit, and a third input sub-circuit. The first input sub-circuit is configured to change a potential of a first node in a first phase. The first output sub-circuit is configured to output a gate driving signal in the first phase and output a compensation driving signal in a second phase. The first reset sub-circuit is
(Continued)

configured to reset the first node. The second input sub-circuit is configured to change a potential of a second node in the first phase and maintain the potential of the second node. The third input sub-circuit is configured to change the potential of the first node in the second phase.

20 Claims, 8 Drawing Sheets

(51) Int. Cl.
    *G09G 3/3225*     (2016.01)
    *G11C 19/28*     (2006.01)
    *G09G 3/36*     (2006.01)

(52) U.S. Cl.
    CPC ... *G09G 3/3674* (2013.01); *G09G 2300/0426* (2013.01); *G09G 2300/0842* (2013.01); *G09G 2310/0286* (2013.01); *G09G 2310/08* (2013.01); *G09G 2320/0233* (2013.01)

(56) References Cited

U.S. PATENT DOCUMENTS

| | | | |
|---|---|---|---|
| 11,328,672 | B2 | 5/2022 | Feng et al. |
| 2010/0188385 | A1 | 7/2010 | Boiko |
| 2018/0204521 | A1* | 7/2018 | Gu ..................... G09G 3/3677 |
| 2018/0286490 | A1 | 10/2018 | Sun et al. |
| 2018/0293924 | A1* | 10/2018 | Wang ..................... G09G 3/20 |
| 2019/0012976 | A1 | 1/2019 | Chen et al. |
| 2019/0096350 | A1* | 3/2019 | Zhao ..................... G09G 3/3677 |
| 2019/0096500 | A1* | 3/2019 | Gu ..................... G09G 3/20 |

FOREIGN PATENT DOCUMENTS

| | | |
|---|---|---|
| CN | 108648716 A | 10/2018 |
| CN | 109448630 A | 3/2019 |
| CN | 109658865 A | 4/2019 |

* cited by examiner in the first phase, the first input sub-circuit changes the potential of the first node from the first level to the second level under control of the first input signal, and the second input sub-circuit changes the potential of the second node from the first level to the second level under control of the second input signal and maintains the potential of the second node at the second level until the second phase subsequent to the first phase  S802 the first output sub-circuit changes the potential of the first node from the second level to the third level under control of the first clock signal so as to output the gate driving signal, and second level is between the first level and the third level  S804 the first reset sub-circuit resets the potential of the first node to the first level under control of the first reset signal  S806 in the second phase, the third input sub-circuit changes the potential of the first node after being reset from the first level to the second level under control of the third input signal  S808 the first output sub-circuit changes the potential of the first node from the second level to the third level under control of the first clock signal so as to output the compensation driving signal  S810

FIG. 8

SHIFT REGISTER UNIT, GATE DRIVING CIRCUIT, DISPLAY DEVICE, AND METHOD FOR CONTROLLING SHIFT REGISTER UNIT

This application is a U.S. National Phase Entry of International Application No. PCT/CN2020/095752, filed on Jun. 12, 2020, designating the United States of America and claiming priority to Chinese Patent Application No. 201910554376.X, filed on Jun. 25, 2019. The present application claims priority to and the benefit of the above-identified applications and the above-identified applications are incorporated by reference herein in their entirety.

TECHNICAL FIELD

The present disclosure relates to the field of display technology, in particular to a shift register unit, a gate driving circuit, a display device, and a method for controlling a shift register unit.

BACKGROUND

In the display technology (for example, organic light-emitting diode (OLED) display technology), gate driving circuits may be used instead of gate integrated circuits, thereby reducing costs. In addition, in the display technology, it may also be necessary to compensate for light emission of sub-pixels.

SUMMARY

According to an aspect of the embodiments of the present disclosure, a shift register unit is provided. The shift register unit comprises: a first input sub-circuit, configured to change a potential of a first node from a first level to a second level under control of a first input signal in a first phase; a first output sub-circuit, electrically connected to the first node and configured to output a gate driving signal under control of a first clock signal in the first phase and output a compensation driving signal under control of the first clock signal in a second phase subsequent to the first phase; a first reset sub-circuit, electrically connected between the first node and a first voltage terminal for providing the first level and configured to reset the potential of the first node to the first level under control of a first reset signal; a second input sub-circuit, electrically connected between the first node and the first voltage terminal and configured to change a potential of a second node from the first level to the second level under control of a second input signal in the first phase and maintain the potential of the second node at the second level until the second phase; and a third input sub-circuit, electrically connected to the second node and configured to change the potential of the first node after being reset from the first level to the second level under control of a third input signal in the second phase.

In some embodiments, the first output sub-circuit is configured to change the potential of the first node from the second level to a third level under control of the first clock signal in the first phase so as to output the gate driving signal, and is configured to change the potential of the first node from the second level to the third level under control of the first clock signal in the second phase so as to output the compensation driving signal, and the second level is between the first level and the third level; and the third input sub-circuit is further configured to change the potential of the second node from the second level to a fourth level under control of the third input signal, and the second level is between the first level and the fourth level.

In some embodiments, the second input sub-circuit comprises a first switching transistor and a first capacitor; a first electrode of the first switching transistor is electrically connected to the first node, a second electrode of the first switching transistor is electrically connected to the second node, and a gate electrode of the first switching transistor is configured to receive the second input signal; and a first terminal of the first capacitor is electrically connected to the second node, and a second terminal of the first capacitor is electrically connected to the first voltage terminal.

In some embodiments, the third input sub-circuit comprises a second switching transistor and a third switching transistor; and a first electrode of the second switching transistor is electrically connected to a gate electrode of the third switching transistor and is configured to receive the third input signal, a second electrode of the second switching transistors is electrically connected to a first electrode of the third switching transistor, a gate electrode of the second switching transistor is electrically connected to the second node, and a second electrode of the third switching transistor is electrically connected to the first node.

In some embodiments, the first reset sub-circuit comprises a fourth switching transistor, a first electrode of the fourth switching transistor is electrically connected to the first node, a second electrode of the fourth switching transistor is electrically connected to the first voltage terminal, and a gate electrode of the fourth switching transistor is configured to receive the first reset signal.

In some embodiments, the shift register unit further comprises: a second reset sub-circuit, configured to reset the potential of the first node and the potential of the second node under control of a second reset signal.

In some embodiments, the second reset sub-circuit comprises a fifth switching transistor, a first electrode of the fifth switching transistor is electrically connected to the first node, a second electrode of the fifth switching transistor is electrically connected to the first voltage terminal, and a gate electrode of the fifth switching transistor is configured to receive the second reset signal.

In some embodiments, the shift register unit further comprises: a second output sub-circuit, configured to output a carry control signal under control of a second clock signal in the first phase.

In some embodiments, the shift register unit further comprises: a noise reduction sub-circuit, configured to maintain the potential of the first node at the first level in the case where the potential of the first node is reset; and a potential maintaining sub-circuit, configured to maintain a potential of an output terminal of the first output sub-circuit at a fifth level in the case where the potential of the first node is reset and maintain a potential of an output terminal of the second output sub-circuit at the first level.

In some embodiments, the noise reduction sub-circuit comprises a sixth switching transistor, a seventh switching transistor, and an eighth switching transistor; a first electrode of the sixth switching transistor and a gate electrode of the sixth switching transistor are both electrically connected to a second voltage terminal for providing the second level, and a second electrode of the sixth switching transistor is electrically connected to a third node; a first electrode of the seventh switching transistor is electrically connected to the third node, a second electrode of the seventh switching transistor is electrically connected to the first voltage terminal, and a gate electrode of the seventh switching transistor is electrically connected to the first node; and a first electrode of the eighth switching transistor is electrically connected to the first node, a second electrode of the eighth switching transistor is electrically connected to the first voltage terminal, and a gate electrode of the eighth switching transistor is electrically connected to the third node.

In some embodiments, the potential maintaining sub-circuit comprises a ninth switching transistor and a tenth switching transistor; a first electrode of the ninth switching transistor is electrically connected to the output terminal of the second output sub-circuit, a second electrode of the ninth switching transistor is electrically connected to the first voltage terminal, and a gate electrode of the ninth switching transistor is electrically connected to a third node; and a first electrode of the tenth switching transistor is electrically connected to the output terminal of the first output sub-circuit, a second electrode of the tenth switching transistor is electrically connected to a third voltage terminal for providing the fifth level, and a gate electrode of the tenth switching transistor is electrically connected to the third node.

In some embodiments, the first output sub-circuit comprises an eleventh switching transistor and a second capacitor; a first electrode of the eleventh switching transistor is configured to receive the first clock signal, a second electrode of the eleventh switching transistor is configured to serve as an output terminal of the first output sub-circuit, and a gate electrode of the eleventh switching transistor is electrically connected to the first node; and a first terminal of the second capacitor is electrically connected to the gate electrode of the eleventh switching transistor, and a second terminal of the second capacitor is electrically connected to the second electrode of the eleventh switching transistor.

In some embodiments, the second output sub-circuit comprises a twelfth switching transistor; and a first electrode of the twelfth switching transistor is configured to receive the second clock signal, a second electrode of the twelfth switching transistor is configured to serve as an output terminal of the second output sub-circuit, and a gate electrode of the twelfth switching transistor is electrically connected to the first node.

In some embodiments, the first input sub-circuit comprises a thirteenth switching transistor; and a first electrode of the thirteenth switching transistor is electrically connected to a fourth voltage terminal for providing the fourth level, a second electrode of the thirteenth switching transistor is electrically connected to the first node, and a gate electrode of the thirteenth switching transistor is configured to receive the first input signal.

In some embodiments, the shift register unit further comprises a second reset sub-circuit, a second output sub-circuit, a noise reduction sub-circuit, and a potential maintaining sub-circuit; the second input sub-circuit comprises a first switching transistor and a first capacitor, a first electrode of the first switching transistor is electrically connected to the first node, a second electrode of the first switching transistor is electrically connected to the second node, a gate electrode of the first switching transistor is configured to receive the second input signal, a first terminal of the first capacitor is electrically connected to the second node, and a second terminal of the first capacitor is electrically connected to the first voltage terminal; the third input sub-circuit comprises a second switching transistor and a third switching transistor, a first electrode of the second switching transistor is electrically connected to a gate electrode of the third switching transistor and is configured to receive the third input signal, a second electrode of the second switching transistor is electrically connected to a first electrode of the third switching transistor, a gate electrode of the second switching transistor is electrically connected to the second node, and a second electrode of the third switching transistor is electrically connected to the first node; the first reset sub-circuit comprises a fourth switching transistor, a first electrode of the fourth switching transistor is electrically connected to the first node, a second electrode of the fourth switching transistor is electrically connected to the first voltage terminal, and a gate electrode of the fourth switching transistor is configured to receive the first reset signal; the second reset sub-circuit comprises a fifth switching transistor, a first electrode of the fifth switching transistor is electrically connected to the first node, a second electrode of the fifth switching transistor is electrically connected to the first voltage terminal, and a gate electrode of the fifth switching transistor is configured to receive a second reset signal; the noise reduction sub-circuit comprises a sixth switching transistor, a seventh switching transistor, and an eighth switching transistor, a first electrode of the sixth switching transistor and a gate electrode of the sixth switching transistor are both electrically connected to a second voltage terminal for providing the second level, a second electrode of the sixth switching transistor is electrically connected to a third node, a first electrode of the seventh switching transistor is electrically connected to the third node, a second electrode of the seventh switching transistor is electrically connected to the first voltage terminal, a gate electrode of the seventh switching transistor is electrically connected to the first node, a first electrode of the eighth switching transistor is electrically connected to the first node, a second electrode of the eighth switching transistor is electrically connected to the first voltage terminal, and a gate electrode of the eighth switching transistor is electrically connected to the third node; the potential maintaining sub-circuit comprises a ninth switching transistor and a tenth switching transistor, a first electrode of the ninth switching transistor is electrically connected to an output terminal of the second output sub-circuit, a second electrode of the ninth switching transistor is electrically connected to the first voltage terminal, a gate electrode of the ninth switching transistor is electrically connected to the third node, a first electrode of the tenth switching transistor is electrically connected to an output terminal of the first output sub-circuit, a second electrode of the tenth switching transistor is electrically connected to a third voltage terminal for providing a fifth level, and a gate electrode of the tenth switching transistor is electrically connected to the third node; the first output sub-circuit comprises an eleventh switching transistor and a second capacitor, a first electrode of the eleventh switching transistor is configured to receive the first clock signal, a second electrode of the eleventh switching transistor is configured to serve as the output terminal of the first output sub-circuit, a gate electrode of the eleventh switching transistor is electrically connected to the first node, a first terminal of the second capacitor is electrically connected to the gate electrode of the eleventh switching transistor, and a second terminal of the second capacitor is electrically connected to the second electrode of the eleventh switching transistor; the second output sub-circuit comprises a twelfth switching transistor, a first electrode of the twelfth switching transistor is configured to receive a second clock signal, a second electrode of the twelfth switching transistor is configured to serve as the output terminal of the second output sub-circuit, and a gate electrode of the twelfth switching transistor is electrically connected to the first node; and the first input sub-circuit comprises a thirteenth switching transistor, a first electrode of the thirteenth switching transistor is electrically connected to a fourth voltage terminal for providing the second level, a second electrode of the thirteenth switching transistor is electrically connected to the first node, and a gate electrode of the thirteenth switching transistor is configured to receive the first input signal.

According to another aspect of the embodiments of the present disclosure, a gate driving circuit is provided. The gate driving circuit comprises a plurality of shift register units described above.

In some embodiments, the plurality of shift register units comprise N shift register units, and N is a positive integer; among the N shift register units, a carry control signal output by an $(i-x_1)$-th shift register unit serves as a first input signal of an i-th shift register unit, and first input signals of a first shift register unit to an $x_1$-th shift register unit are first input signals output by an external circuit, respectively, $x_1+1 \leq i \leq N$, i is a positive integer, and $x_1$ is a positive integer; and among the N shift register units, a carry control signal output by a $(j+x_2)$-th shift register unit serves as a first reset signal of a j-th shift register unit, first reset signals of an $(N-x_2+1)$-th shift register unit to an N-th shift register unit are first reset signals output by the external circuit, respectively, $1 \leq j \leq N-x_2$, j is a positive integer, and $x_2$ is a positive integer.

According to another aspect of the embodiments of the present disclosure, a display device is provided. The display device comprises the gate driving circuit described above.

According to another aspect of the embodiments of the present disclosure, a method for controlling a shift register unit is provided. The method comprises: in a first phase, a first input sub-circuit changing a potential of a first node from a first level to a second level under control of a first input signal, a second input sub-circuit changing a potential of a second node from the first level to the second level under control of a second input signal and maintaining the potential of the second node at the second level until a second phase subsequent to the first phase; a first output sub-circuit changing the potential of the first node from the second level to a third level under control of a first clock signal so as to output a gate driving signal, and the second level being between the first level and the third level; a first reset sub-circuit resetting the potential of the first node to the first level under control of a first reset signal; in the second phase, a third input sub-circuit changing the potential of the first node after being reset from the first level to the second level under control of a third input signal; and the first output sub-circuit changing the potential of the first node from the second level to the third level under control of the first clock signal so as to output a compensation driving signal.

Through the following detailed description of the exemplary embodiments of the present disclosure with reference to the accompanying drawings, other features and advantages of the present disclosure will become clear.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

FIG. 8 is a flowchart of a method for controlling a shift register unit according to an embodiment of the present disclosure.

DETAILED DESCRIPTION

Figure 1:
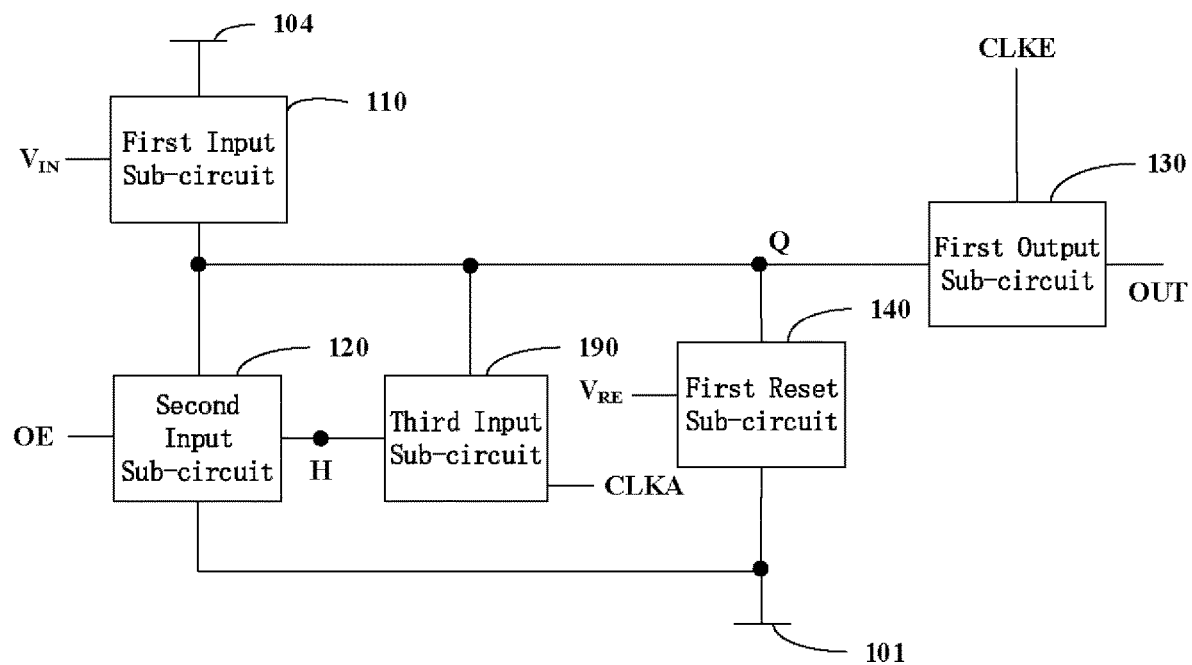
FIG. 1 is a structural diagram of a shift register unit according to an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the present disclosure, when a specific device located between the first device and the second device is described, there may or may not be an intermediate device between the specific device and the first device or the second device. When a specific device is described to be electrically connected to the other device, the specific device may be in direct electrical connection with the other device without an intervening device, or may not be in direct electrical connection with the other device but having an intervening device in the electrical connection.

All terms (including technical terms or scientific terms) used in the present disclosure have the same meanings as understood by those skilled in the art to which the present disclosure belongs, unless specifically defined otherwise. It should also be understood that terms such as those defined in general-purpose dictionaries should be interpreted as having meanings consistent with the context of related technology, and should not be interpreted in idealized or extremely formalized meanings, unless explicitly defined herein.

The technology, method, and equipment known to those skilled in the relevant art may not be discussed in detail, but the technology, method, and equipment should be regarded as part of the specification in the appropriate case.

The OLED display panel includes a pixel array, and the pixel array includes sub-pixel units arranged in a plurality of rows and a plurality of columns. Each sub-pixel unit includes a pixel circuit and a light-emitting element. The pixel circuit receives various signals to drive the light-emitting element to emit light, and the pixel circuit may include a driving transistor, a scanning transistor, a storage capacitor, and the like. The threshold voltage of the driving transistor in each pixel circuit may be different from each other due to the manufacturing process, and the threshold voltage of the driving transistor may shift due to the influence of the change of temperature, for example. Therefore, difference in threshold voltages of respective driving transistors may cause poor display (for example, non-uniform display), and the threshold voltage needs to be compensated. When compensating for the sub-pixel unit in the OLED display panel, in addition to providing the pixel compensation circuit in the sub-pixel unit for internal compensation, external compensation may also be performed by providing a sensing transistor. In the case of external compensation, for example, the sensing transistor may be additionally provided in the traditional 2T1C (a driving transistor, a scanning transistor, and a storage capacitor) pixel circuit, so that a 3T1C (a driving transistor, a scanning transistor, a sensing transistor, and a storage capacitor) pixel circuit is obtained. For example, the driving transistor may be an N-type transistor, the first electrode of the sensing transistor may be connected to the source electrode of the driving transistor, the second electrode of the sensing transistor may be connected to a sensing circuit through a sensing line, and the gate electrode of the sensing transistor is configured to receive a compensation driving signal through the gate line (for example, the gate electrode of the sensing transistor and the gate electrode of the scanning transistor may be connected to the same gate line). When external compensation is performed, the gate driving circuit composed of shift register units needs to provide driving signals for scanning transistors and sensing transistors to sub-pixel units in the display panel, respectively. For example, the scanning driving signal for the scanning transistor is provided in the display phase of one frame, and the compensation driving signal for the sensing transistor is provided in the field blanking phase of one frame. For example, these two driving signals may be waveforms with different periods and different pulse widths.

The inventor of the present disclosure found that it is relatively difficult for the gate driving circuit to output the gate driving signal for display and the compensation driving signal for sub-pixel compensation.

In view of this, the embodiments of the present disclosure provide a shift register unit for a gate driving circuit, so as to facilitate outputting a gate driving signal and a compensation driving signal, respectively. Hereinafter, the shift register unit according to some embodiments of the present disclosure will be described in detail with reference to the accompanying drawings.

FIG. 1 is a structural diagram of a shift register unit according to an embodiment of the present disclosure. As illustrated in FIG. 1, the shift register unit may include a first input sub-circuit 110, a first output sub-circuit 130, a first reset sub-circuit 140, a second input sub-circuit 120, and a third input sub-circuit 190.

The first input sub-circuit 110 may be configured to change a potential of a first node Q from a first level to a second level under control of a first input signal $V_{IN}$ in a first phase.

The first output sub-circuit 130 is electrically connected to the first node Q. The first output sub-circuit 130 may be configured to output a gate driving signal under control of a first clock signal CLKE in the first phase and output a compensation driving signal under control of the first clock signal CLKE in a second phase subsequent to the first phase. "OUT" in FIG. 1 represents the signal output by the first output sub-circuit.

The first reset sub-circuit 140 is electrically connected between the first node Q and a first voltage terminal 101. The first voltage terminal 101 is used to provide the first level. The first reset sub-circuit 140 may be configured to reset the potential of the first node Q under control of a first reset signal $V_{RE}$. For example, the first reset sub-circuit can reset the potential of the first node of the shift register unit of the current row, so that the potential of the first node can be reset to the first level.

The second input sub-circuit 120 is electrically connected between the first node Q and the first voltage terminal 101. The first voltage terminal 101 is used to provide the first level. The second input sub-circuit 120 may be configured to change a potential of a second node H from the first level to the second level under control of a second input signal OE in the first phase and maintain the potential of the second node H at the second level until the second phase.

The third input sub-circuit 190 is electrically connected to the second node H. The third input sub-circuit 190 is configured to change the potential of the first node Q after being reset from the first level to the second level under control of a third input signal CLKA in the second phase.

For example, in this embodiment, the first phase may be the display phase of one frame, and the second phase may be the field blanking phase of one frame. It should be noted that the meanings of the first phase and the second phase in the subsequent embodiments may be the same as the meanings of the first phase and the second phase in this embodiment.

So far, the shift register unit according to some embodiments of the present disclosure is provided. The shift register unit includes the first input sub-circuit, the first output sub-circuit, the first reset sub-circuit, the second input sub-circuit, and the third input sub-circuit. The first input sub-circuit changes the potential of the first node from the first level to the second level under control of the first input signal in the first phase. The first output sub-circuit outputs the gate driving signal under control of the first clock signal in the first phase, and outputs the compensation driving signal under control of the first clock signal in the second phase. The first reset sub-circuit resets the potential of the first node under control of the first reset signal. The second input sub-circuit changes the potential of the second node from the first level to the second level under control of the second input signal in the first phase, and maintains the potential of the second node at the second level until the second phase. The third input sub-circuit changes the potential of the first node after being reset from the first level to the second level under control of the third input signal in the second phase. In this embodiment, the shift register unit achieves the purpose of outputting the gate driving signal in the first phase (for example, the display phase) and outputting the compensation driving signal in the second phase (for example, the field blanking phase).

It should be noted that the gate driving signal can be used in the display process of the display device and output through the corresponding gate line, and the compensation driving signal is also output through the corresponding gate line as the required gate signal in the sub-pixel compensation process. The method or process of the sub-pixel compensation may adopt the known technology, and details are not described herein.

In some embodiments, the first output sub-circuit 130 may be configured to change the potential of the first node Q from the second level to a third level under control of the first clock signal CLKE in the first phase, so as to output the gate driving signal, and configured to change the potential of the first node Q from the second level to the third level under control of the first clock signal CLKE in the second phase, so as to output the compensation driving signal. The second level is between the first level and the third level.

In some embodiments, the first level is lower than the second level, and the second level is lower than the third level. For example, the first level is a low level, the second level is a high level, and the third level is a level higher than the second level. In other embodiments, the first level is higher than the second level, and the second level is higher than the third level. For example, the first level is a high level, the second level is a low level, and the third level is a level lower than the second level.

In some embodiments, the third input sub-circuit 190 may further be configured to change the potential of the second node from the second level to a fourth level under control of a third input signal CLKA. The second level is between the first level and the fourth level.

In some embodiments, the first level is lower than the second level, and the second level is lower than the fourth level. For example, the first level is a low level, the second level is a high level, and the fourth level is a level higher than the second level. In other embodiments, the first level is higher than the second level, and the second level is higher than the fourth level. For example, the first level is a high level, the second level is a low level, and the fourth level is a level lower than the second level. The fourth level may be equal to the third level, or may not be equal to the third level.

Figure 2:
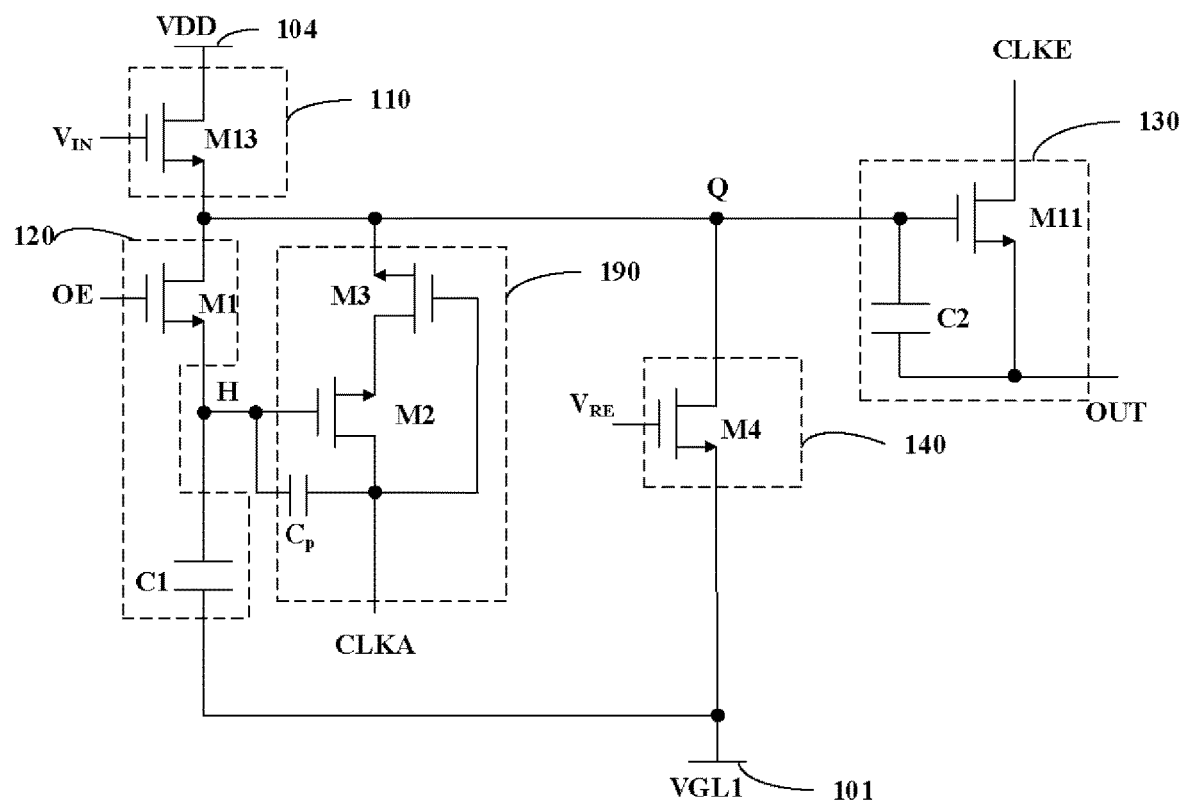
FIG. 2 is a circuit structure diagram of a shift register unit according to an embodiment of the present disclosure.

FIG. 2 is a circuit structure diagram of a shift register unit according to an embodiment of the present disclosure.

In some embodiments, as illustrated in FIG. 2, the second input sub-circuit 120 may include a first switching transistor M1 and a first capacitor C1.

A first electrode of the first switching transistor M1 is electrically connected to the first node Q. A second electrode of the first switching transistor M1 is electrically connected to the second node H. A gate electrode of the first switching transistor M1 is configured to receive the second input signal OE. For example, the first switching transistor M1 may be an N-channel metal oxide semiconductor (NMOS) transistor or a P-channel metal oxide semiconductor (PMOS) transistor. A first terminal of the first capacitor C1 is electrically connected to the second node H. A second terminal of the first capacitor C1 is electrically connected to the first voltage terminal 101. For example, the first voltage terminal may be used to provide a low level VGL1 (serves as the first level). For example, the low level VGL1 may be a negative level. For example, the first capacitor C1 may be an external capacitor or a parasitic capacitor.

In some embodiments, as illustrated in FIG. 2, the third input sub-circuit 190 may include a second switching transistor M2 and a third switching transistor M3.

A first electrode of the second switching transistor M2 is electrically connected to a gate electrode of the third switching transistor M3. The first electrode of the second switching transistor M2 is configured to receive the third input signal CLKA. A second electrode of the second switching transistor M2 is electrically connected to a first electrode of the third switching transistor M3. A gate electrode of the second switching transistor M2 is electrically connected to the second node H. In addition, FIG. 2 also illustrates the parasitic capacitor $C_p$ of the second switching transistor M2. A first terminal of the parasitic capacitor $C_p$ is electrically connected to the gate electrode of the second switching transistor M2, and a second terminal of the parasitic capacitor $C_p$ is electrically connected to the first electrode of the second switching transistor M2. A second electrode of the third switching transistor M3 is electrically connected to the first node Q.

For example, the second switching transistor M2 may be an NMOS transistor or a PMOS transistor, and the third switching transistor M3 may be an NMOS transistor or a PMOS transistor.

In some embodiments, as illustrated in FIG. 2, the first reset sub-circuit 140 may include a fourth switching transistor M4. A first electrode of the fourth switching transistor M4 is electrically connected to the first node Q. A second electrode of the fourth switching transistor M4 is electrically connected to the first voltage terminal 101. A gate electrode of the fourth switching transistor M4 is configured to receive the first reset signal $V_{RE}$. For example, the fourth switching transistor M4 may be an NMOS transistor or a PMOS transistor.

In some embodiments, as illustrated in FIG. 2, the first output sub-circuit 130 may include an eleventh switching transistor M11 and a second capacitor C2. A first electrode of the eleventh switching transistor M11 is configured to receive the first clock signal CLKE. A second electrode of the eleventh switching transistor M11 serves as the output terminal of the first output sub-circuit 130. A gate electrode of the eleventh switching transistor M11 is electrically connected to the first node Q. A first terminal of the second capacitor C2 is electrically connected to the gate electrode of the eleventh switching transistor M11. A second terminal of the second capacitor C2 is electrically connected to the second electrode of the eleventh switching transistor M11. For example, the eleventh switching transistor M11 may be an NMOS transistor or a PMOS transistor. For example, the second capacitor C2 may be an external capacitor or a parasitic capacitor of the eleventh switching transistor M11.

In some embodiments, as illustrated in FIG. 2, the first input sub-circuit 110 may include a thirteenth switching transistor M13. A first electrode of the thirteenth switching transistor M13 is electrically connected to a fourth voltage terminal 104 for providing the second level. A second electrode of the thirteenth switching transistor M13 is electrically connected to the first node Q. A gate electrode of the thirteenth switching transistor M13 is configured to receive the first input signal $V_{IN}$. For example, the thirteenth switching transistor M13 may be an NMOS transistor or a PMOS transistor.

So far, the specific circuit structure of the above-mentioned sub-circuits of the shift register unit according to some embodiments of the present disclosure has been described. The above-mentioned sub-circuits can respectively achieve corresponding functions, so that the shift register unit can achieve the purpose of outputting the gate driving signal and the compensation driving signal, respectively.

Figure 3A:
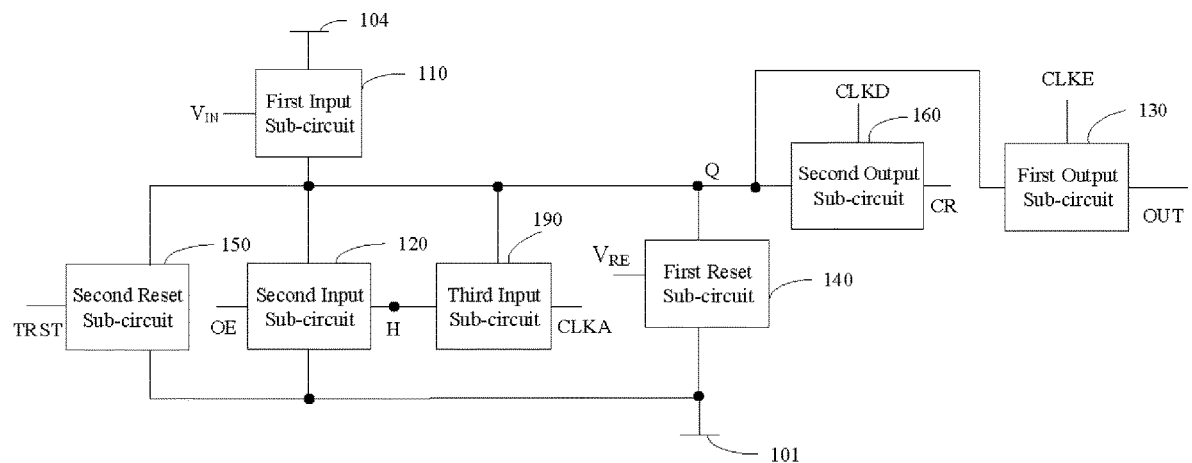
FIG. 3A is a structural diagram of a shift register unit according to another embodiment of the present disclosure.
Figure 3B:
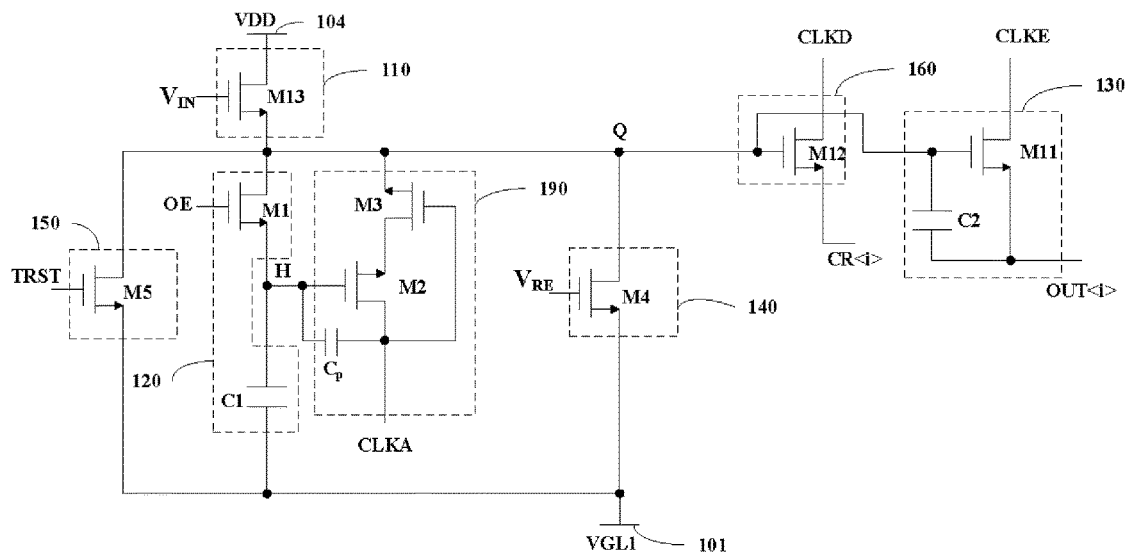
FIG. 3B is a circuit structure diagram of a shift register unit according to another embodiment of the present disclosure.

FIG. 3A is a structural diagram of a shift register unit according to another embodiment of the present disclosure. FIG. 3B is a circuit structure diagram of a shift register unit according to another embodiment of the present disclosure. As illustrated in FIG. 3A, the shift register unit may include the first input sub-circuit 110, the first output sub-circuit 130, the first reset sub-circuit 140, the second input sub-circuit 120, and the third input sub-circuit 190.

In some embodiments, as illustrated in FIG. 3A, the shift register unit may further include a second reset sub-circuit 150. The second reset sub-circuit 150 may be configured to reset the potential of the first node Q and the potential of the second node H under control of a second reset signal TRST. For example, the second reset sub-circuit can implement simultaneous reset of shift register units of the full screen.

In some embodiments, as illustrated in FIG. 3B, the second reset sub-circuit 150 may include a fifth switching transistor M5. A first electrode of the fifth switching transistor M5 is electrically connected to the first node Q. A second electrode of the fifth switching transistor M5 is electrically connected to the first voltage terminal 101. A gate electrode of the fifth switching transistor M5 is configured to receive the second reset signal TRST. For example, the fifth switching transistor M5 may be an NMOS transistor or a PMOS transistor.

In the above embodiments, the second reset sub-circuit is provided in the shift register unit, so that the reset control of shift register units of the full screen can be achieved.

In some embodiments, as illustrated in FIG. 3A, the shift register unit may further include a second output sub-circuit 160. The second output sub-circuit 160 may be configured to output a carry control signal CR under control of the second clock signal CLKD in the first phase. The carry control signal CR may be output to other shift register units. For example, the carry control signal CR can be used as the first input signal $V_{IN}$ of the shift register unit of a certain row, or can be used as the first reset signal $V_{RE}$ of the shift register unit of another row.

In some embodiments, as illustrated in FIG. 3B, the second output sub-circuit 160 may include a twelfth switching transistor M12. A first electrode of the twelfth switching transistor M12 is configured to receive the second clock signal CLKD. A second electrode of the twelfth switching transistor M12 serves as the output terminal of the second output sub-circuit 160. A gate electrode of the twelfth switching transistor M12 is electrically connected to the first node Q. For example, the twelfth switching transistor M12 may be an NMOS transistor or a PMOS transistor.

In the above-mentioned embodiments, the second output sub-circuit is provided in the shift register unit, so that the carry control between different shift register units can be achieved.

Figure 4:
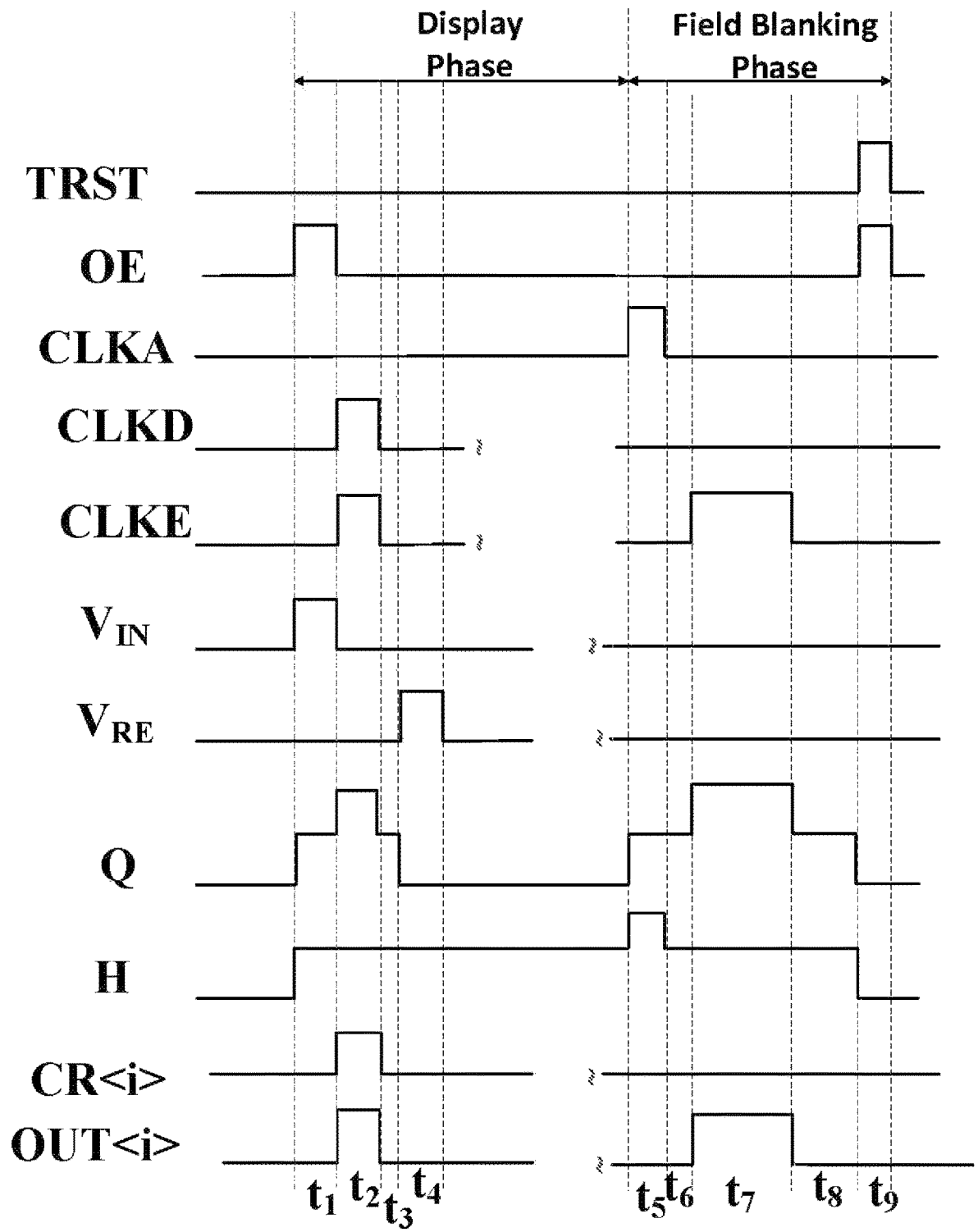
FIG. 4 is a timing diagram of control signals for a shift register unit according to an embodiment of the present disclosure.

FIG. 4 is a timing diagram of control signals for a shift register unit according to an embodiment of the present disclosure. The working process of the shift register unit according to some embodiments of the present disclosure is described in detail below with reference to FIG. 3A, FIG. 3B, and FIG. 4. Here, it is described by taking that each switching transistor in the shift register unit is an NMOS transistor, the first level is a low level, and the second level is a high level as an example. In the display process of one image frame, there are a first phase and a second phase. For example, the first phase is a display phase of one frame, and the second phase is a field blanking phase of one frame. As illustrated in FIG. 4, the first phase (for example, the display phase) may include four periods, i.e., the first period (that is, the $t_1$ period) to the fourth period (that is, the $t_4$ period), and the second phase (for example, the field blanking phase) may include five periods, i.e., the fifth period (that is, the $t_5$ period) to the ninth period (that is, the $t_9$ period).

As illustrated in FIG. 4, in the first period (that is, the $t_1$ period), the first input signal $V_{IN}$ and the second input signal OE are at a high level, and the first reset signal $V_{RE}$, the second reset signal TRST, the first clock signal CLKE, the second clock signal CLKD, and the third input signal CLKA are all at a low level. In this case, the thirteenth switching transistor M13 is turned on, and the potential of the first node Q is pulled up to the second level. The first switching transistor M1 is turned on, and the potential of the second node H also changes to the second level. The first output sub-circuit 130 outputs a low-level gate driving signal OUT<i>, and the second output sub-circuit 160 outputs a low-level carry control signal CR<i>. Here, OUT<i> represents the gate driving signal output by the i-th shift register unit (serves as the current shift register unit), CR<i> represents the carry control signal output by the i-th shift register unit (serves as the current shift register unit), and i is a positive integer. In this example, the low-level gate driving signal serves as an invalid gate driving signal, and the low-level carry control signal serves as an invalid carry control signal.

Next, as illustrated in FIG. 4, in the second period (that is, the $t_2$ period), the first clock signal CLKE and the second clock signal CLKD change to a high level, and the first input signal $V_{IN}$, the second input signal OE, the first reset signal $V_{RE}$, the second reset signal TRST, and the third input signal CLKA are all at a low level. In this case, due to the bootstrap action of the second capacitor C2, the potential of the first node Q is continuously pulled up to the third level. The first output sub-circuit 130 outputs a high-level gate driving signal OUT<i>, and the second output sub-circuit 160 outputs a high-level carry control signal CR<i>. In this example, the high-level gate driving signal serves as an effective gate driving signal, and the high-level carry control signal serves as an effective carry control signal.

Next, as illustrated in FIG. 4, in the third period (that is, the $t_3$ period), the first clock signal CLKE and the second clock signal CLKD change to a low level, the potential of the first node Q decreases, the first output sub-circuit 130 outputs a low-level gate driving signal OUT<i>, and the second output sub-circuit 160 outputs a low-level carry control signal CR<i>.

Next, as illustrated in FIG. 4, in the fourth period (that is, the $t_4$ period), the first reset signal $V_{RE}$ changes to a high level, and the first clock signal CLKE, the second clock signal CLKD, the first input signal $V_{IN}$, the second input signal OE, the second reset signal TRST, and the third input signal CLKA are all at a low level. In this case, the fourth switching transistor M4 is turned on, and the potential of the first node Q changes to a low level (that is, the first level), so that the potential of the first node Q is reset.

In the above process, the shift register unit achieves the purpose of outputting the gate driving signal in the first phase (for example, the display phase). In the above process, the potential of the second node H maintains at a high level (i.e., the second level) and remains until the second phase (for example, the field blanking phase).

Next, as illustrated in FIG. 4, in the fifth period (i.e., $t_5$ period), the third input signal CLKA is at a high level, the potential of the second node H remains at a high level, and the first reset signal $V_{RE}$, the first clock signal CLKE, the second clock signal CLKD, the first input signal $V_{IN}$, the second input signal OE, and the second reset signal TRST are all at a low level. In this case, the second switching transistor M2 and the third switching transistor M3 are turned on, and the potential of the first node Q changes from the low level (i.e., the first level) to the high level (i.e., the second level). In addition, the second switching transistor M2 has the parasitic capacitor $C_p$. Through the bootstrap action of the parasitic capacitor $C_p$, the potential of the second node H continues to be pulled up. Therefore, the potential of the second node H changes from the second level to the higher fourth level.

Next, as illustrated in FIG. 4, in the sixth period (that is, the $t_6$ period), the third input signal CLKA changes to a low level, and the potential of the second node H decreases by changing from the fourth level to the second level.

Next, as illustrated in FIG. 4, in the seventh period (that is, the $t_7$ period), the first clock signal CLKE changes to a high level, and the first reset signal $V_{RE}$, the second reset signal TRST, the second clock signal CLKD, the first input signal $V_{IN}$, the second input signal OE, and the third input signal CLKA are all at a low level. In this case, due to the bootstrap action of the second capacitor C2, the potential of the first node Q is continuously pulled up to the third level. In this way, the first output sub-circuit 130 outputs a high-level compensation driving signal OUT<i>. In this example, the high-level compensation driving signal serves as an effective compensation driving signal.

Next, as illustrated in FIG. 4, in the eighth period (that is, the $t_8$ period), the first clock signal CLKE changes to a low level. Accordingly, the potential of the first node Q is decreased from the third level to the second level. The first output sub-circuit 130 outputs a low-level compensation driving signal OUT<i>. In this embodiment, the low-level compensation driving signal serves as an invalid compensation driving signal.

Next, as illustrated in FIG. 4, in the ninth period (that is, the $t_9$ period), both the second input signal OE and the second reset signal TRST change to a high level. In this case, the first switching transistor M1 and the fifth switching transistor M5 are turned on, so that both the first node Q and the second node H are reset to a low level (i.e., the first level). In this way, the process of outputting the compensation driving signal of the shift register unit is completed.

So far, the working process of the shift register unit according to some embodiments of the present disclosure has been described. In this working process, the shift register unit outputs the gate driving signal in the first phase (for example, the display phase), and outputs the compensation driving signal in the second phase (for example, the field blanking phase). The gate driving signal can be used to turn on the switching transistor (for example, the scanning transistor) of the corresponding sub-pixel circuit during the display process of the display device, and the compensation driving signal can be used to enable the corresponding switching transistor (for example, the sensing transistor) to be turned on during the compensation process of the corresponding sub-pixel circuit. Therefore, the shift register unit can achieve the function of outputting different signals in different phases without affecting the normal display of the display device. The gate driving signal and the compensation driving signal may have different periods and different pulse widths, respectively.

In some embodiments, the pulse width relationship of the first clock signal CLKE, the second clock signal CLKD, the third input signal CLKA, and the second reset signal TRST may be adjusted. In some embodiments, the second input signal OE may be a random signal generated by an external circuit (for example, a field programmable gate array (FPGA), etc.). Because the second input signal OE is a random signal, random sensing of the sub-pixel unit row in the display panel (which is described later) can be achieved by the second input signal OE, so that subsequent compensation operations are performed according to the sensing result.

Figure 5A:
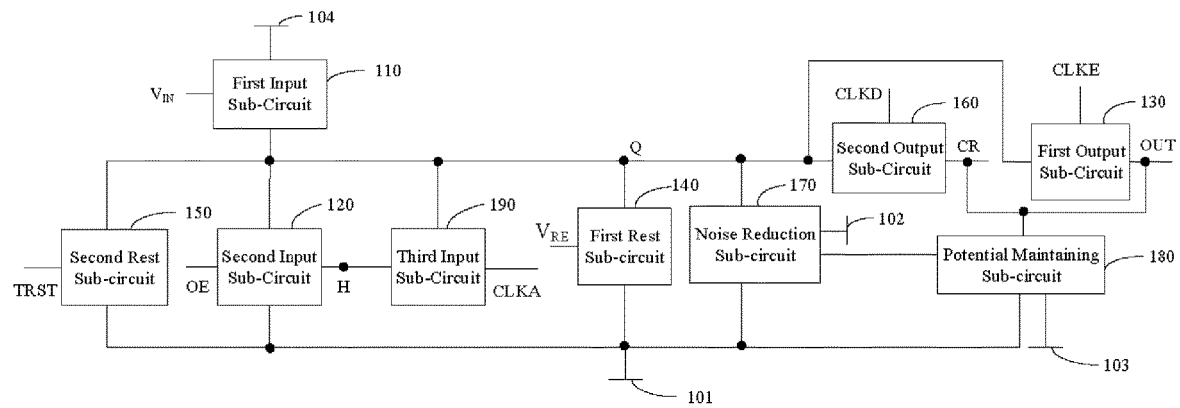
FIG. 5A is a structural diagram of a shift register unit according to still another embodiment of the present disclosure.
Figure 5B:
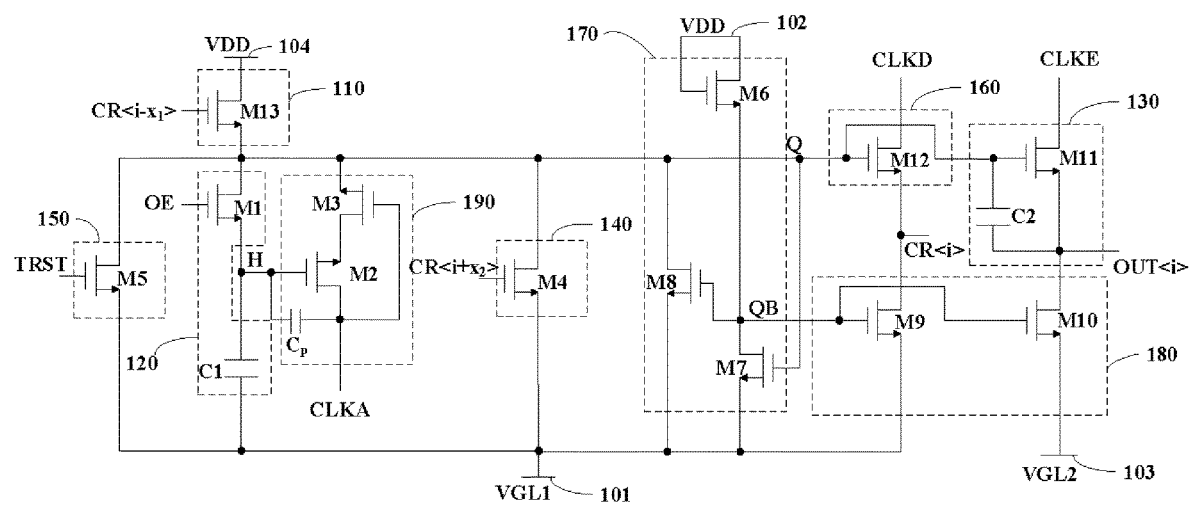
FIG. 5B is a circuit structure diagram of a shift register unit according to still another embodiment of the present disclosure.

FIG. 5A is a structural diagram of a shift register unit according to still another embodiment of the present disclosure. FIG. 5B is a circuit structure diagram of a shift register unit according to still another embodiment of the present disclosure. As illustrated in FIG. 5A, the shift register unit may include the first input sub-circuit 110, the first output sub-circuit 130, the first reset sub-circuit 140, the second input sub-circuit 120, the third input sub-circuit 190, the second reset sub-circuit 150, and the second output sub-circuit 160.

In some embodiments, as illustrated in FIG. 5A, the shift register unit may further include a noise reduction sub-circuit 170. The noise reduction sub-circuit 170 may be configured to maintain the potential of the first node Q at the first level in the case where the potential of the first node Q is reset, so as to further ensure that the first node is completely reset and reduce noise.

In some embodiments, as illustrated in FIG. 5B, the noise reduction sub-circuit 170 may include a sixth switching transistor M6, a seventh switching transistor M7, and an eighth switching transistor M8.

As illustrated in FIG. 5B, both the first electrode of the sixth switching transistor M6 and gate electrode of the sixth switching transistor M6 are electrically connected to a second voltage terminal 102 for providing the second level. A second electrode of the sixth switching transistor M6 is electrically connected to a third node QB. For example, the sixth switching transistor M6 may be an NMOS transistor or a PMOS transistor. For example, the second level is a high level (for example, the power supply voltage VDD). A first electrode of the seventh switching transistor M7 is electrically connected to the third node QB. A second electrode of the seventh switching transistor M7 is electrically connected to the first voltage terminal 101. A gate electrode of the seventh switching transistor M7 is electrically connected to the first node Q. For example, the seventh switching transistor M7 may be an NMOS transistor or a PMOS transistor. A first electrode of the eighth switching transistor M8 is electrically connected to the first node Q. A second electrode of the eighth switching transistor M8 is electrically connected to the first voltage terminal 101. A gate electrode of the eighth switching transistor M8 is electrically connected to the third node QB. For example, the eighth switching transistor M8 may be an NMOS transistor or a PMOS transistor.

The following is described by taking it as an example that the sixth switching transistor M6, the seventh switching transistor M7, and the eighth switching transistor M8 are all NMOS transistors. In the working process described above, the first node Q is reset in a certain phase or phases (for example, the $t_4$ period or the $t_9$ period). In the case where the first node Q is reset to a low level (i.e., the first level), the seventh switching transistor M7 is turned off. The second voltage terminal 102 outputs a high-level power supply voltage VDD, which allows the sixth switching transistor M6 to be turned on and further allows the third node QB to be at a high level. In this case, the eighth switching transistor M8 is turned on. Therefore, the first node Q can be sufficiently pulled down to the potential of the first voltage terminal 101, that is, the potential of the first node Q is maintained at the first level. In this way, it can be ensured that the first node is completely reset, which has the effect of reducing noise.

In some embodiments, as illustrated in FIG. 5A, the shift register unit may further include a potential maintaining sub-circuit 180. The potential maintaining sub-circuit 180 may be configured to maintain the potential of the output terminal of the first output sub-circuit 130 at a fifth level and maintain the potential of the output terminal of the second output sub-circuit 160 at the first level in the case where the potential of the first node Q is reset. The fifth level is of the same type as the first level. That is, in the case where the first level is a low level, the fifth level is also a low level; and in the case where the first level is a high level, the fifth level is also a high level. In some embodiments, the fifth level may be equal to the first level. In other embodiments, the fifth level may be different from the first level. For example, the fifth level is higher than the first level.

In some embodiments, as illustrated in FIG. 5B, the potential maintaining sub-circuit 180 may include a ninth switching transistor M9 and a tenth switching transistor M10. A first electrode of the ninth switching transistor M9 is electrically connected to the output terminal of the second output sub-circuit 160 (for example, the second electrode of the twelfth switching transistor M12). A second electrode of the ninth switching transistor M9 is electrically connected to the first voltage terminal 101. A gate electrode of the ninth switching transistor M9 is electrically connected to the third node QB. For example, the ninth switching transistor M9 may be an NMOS transistor or a PMOS transistor. A first electrode of the tenth switching transistor M10 is electrically connected to the output terminal of the first output sub-circuit 130 (for example, the second electrode of the eleventh switching transistor M11). A second electrode of the tenth switching transistor M10 is electrically connected to a third voltage terminal 103 for providing the fifth level. A gate electrode of the tenth switching transistor M10 is electrically connected to the third node QB. For example, the tenth switching transistor M10 may be an NMOS transistor or a PMOS transistor. For example, the fifth level may be a low level VGL2 (for example, a negative level).

The following is described by taking it as an example that both the ninth switching transistor M9 and the tenth switching transistor M10 are NMOS transistors. In the case where the first node Q is at a high level, the seventh switching transistor M7 is turned on, and the third node QB is at a low level, so that the ninth switching transistor M9 and the tenth switching transistor M10 are turned off, which may not affect the output signal of the first output sub-circuit 130 and the output signal of the second output sub-circuit 160. In the case where the first node Q is reset to a low level, the seventh switching transistor M7 is turned off. Because the sixth switching transistor M6 is turned on, the third node QB is at a high level, so that the ninth switching transistor M9 and the tenth switching transistor M10 are turned on. In this way, the output terminal of the second output sub-circuit 160 can be pulled down to the low level VGL1 (that is, the first level) of the first voltage terminal 101, and the output terminal of the first output sub-circuit 130 can be pulled down to the low level VGL2 (that is, the fifth level) of the third voltage terminal 103, so as to facilitate maintaining the potential of the output terminal of the first output sub-circuit and the potential of the output terminal of the second output sub-circuit at a low level, thereby reducing noise.

In some embodiments of the present disclosure, a gate driving circuit is further provided. The gate driving circuit may include a plurality of shift register units as described above (for example, the shift register unit illustrated in FIG. 1, FIG. 2, FIG. 3A, FIG. 3B, FIG. 5A, or FIG. 5B).

In some embodiments, the plurality of shift register units may include N shift register units, and N is a positive integer. Among the N shift register units, the carry control signal output by the $(i-x_1)$-th shift register unit is used as the first input signal of the i-th shift register unit, and the first input signals of the first shift register unit to the $x_1$-th shift register unit are the first input signals output by an external circuit, respectively. $x_1+1 \le i \le N$, i is a positive integer, and $x_1$ is a positive integer. Among the N shift register units, the carry control signal output by the $(j+x_2)$-th shift register unit is used as the first reset signal of the j-th shift register unit, and first reset signals of the $(N-x_2+1)$-th shift register unit to the N-th shift register unit are the first reset signals output by the external circuit, respectively. $1 \le j \le N-x_2$, j is a positive integer, and $x_2$ is a positive integer.

It should be noted that the external circuit may be a known integrated circuit or the like. The external circuit can be used to output the first input signal and the first reset signal. For example, the external circuit can output different signals in different phases.

Figure 6:
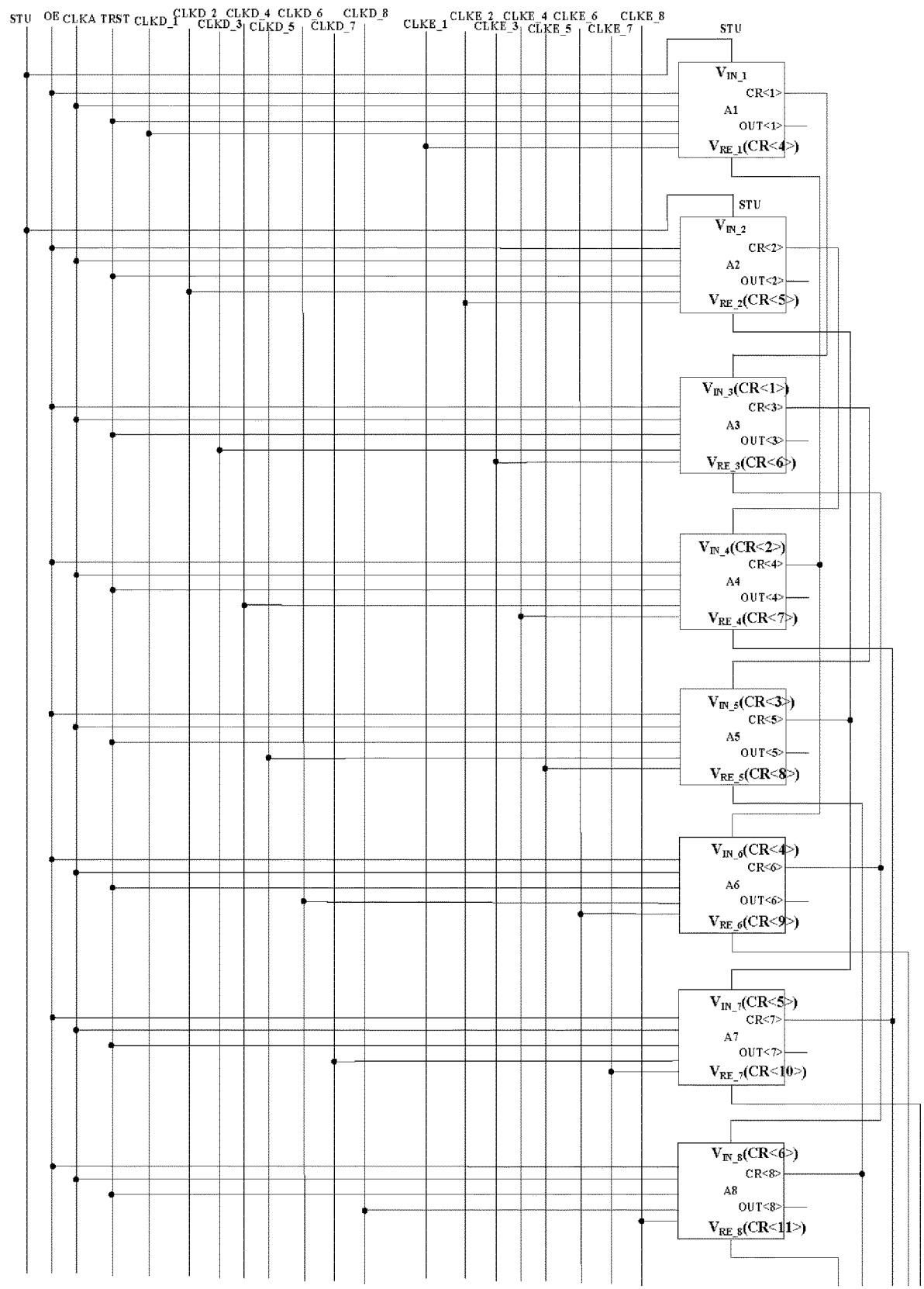
FIG. 6 is a structural diagram of a gate driving circuit according to an embodiment of the present disclosure.

FIG. 6 is a structural diagram of a gate driving circuit according to an embodiment of the present disclosure. FIG. 6 illustrates the case where eight shift register units (A1 to A8) form a unit group. FIG. 6 illustrates a start signal STU, a second input signal OE, a third input signal CLKA, a second reset signal TRST, eight first clock signals CLKE_1 to CLKE_8, and eight second clock signals CLKD_1 to CLKD_8. Here, in the gate driving circuit, the first clock signal repeats every eight and the second clock signal repeats every eight.

In the following, the gate driving circuit provided by some embodiments of the present disclosure is described in detail with reference to FIG. 6 by taking $x_1=2$ and $x_2=3$ as an example.

In some embodiments, the carry control signal CR<i−2> output by the (i−2)-th shift register unit is used as the first input signal of the i-th shift register unit. For example, as illustrated in FIG. 6, the carry control signal CR<1> output by the first shift register unit A1 is used as the first input signal $V_{IN\_}3$ of the third shift register unit A3, the carry control signal CR<2> output by the second shift register unit A2 is used as the first input signal $V_{IN\_}4$ of the fourth shift register unit A4, and so on. In addition, the first input signals of the first shift register unit A1 and the second shift register unit A2 are the start signal STU output by an external circuit, respectively (not illustrated in FIG. 6).

In some embodiments, the carry control signal CR<j+3> output by the (j+3)-th shift register unit is used as the first reset signal of the j-th shift register unit. For example, as illustrated in FIG. 6, the carry control signal CR<4> output by the fourth shift register unit A4 is used as the first reset signal $V_{RE\_}1$ of the first shift register unit A1, the carry control signal CR<5> output by the fifth shift register unit A5 is used as the first reset signal $V_{RE\_}2$ of the second shift register unit A2, and so on. In addition, first reset signals of the (N−2)-th shift register unit, the (N−1)-th shift register unit, and the N-th shift register unit are respectively the first reset signal output by an external circuit (not illustrated in FIG. 6).

So far, the gate driving circuit according to some embodiments of the present disclosure has been described in detail. By controlling the operation of each shift register unit in the gate driving circuit, the gate driving circuit can output the gate driving signal in the first phase (for example, the display phase) and output the compensation driving signal in the second phase (for example, the field blanking phase).

It should be noted that although FIG. 6 illustrates the case where eight shift register units form a unit group, the protection scope of the embodiments of the present disclosure is not limited to this. For example, another number (for example, 4 or more) of shift register units may also be a unit group.

Figure 7:
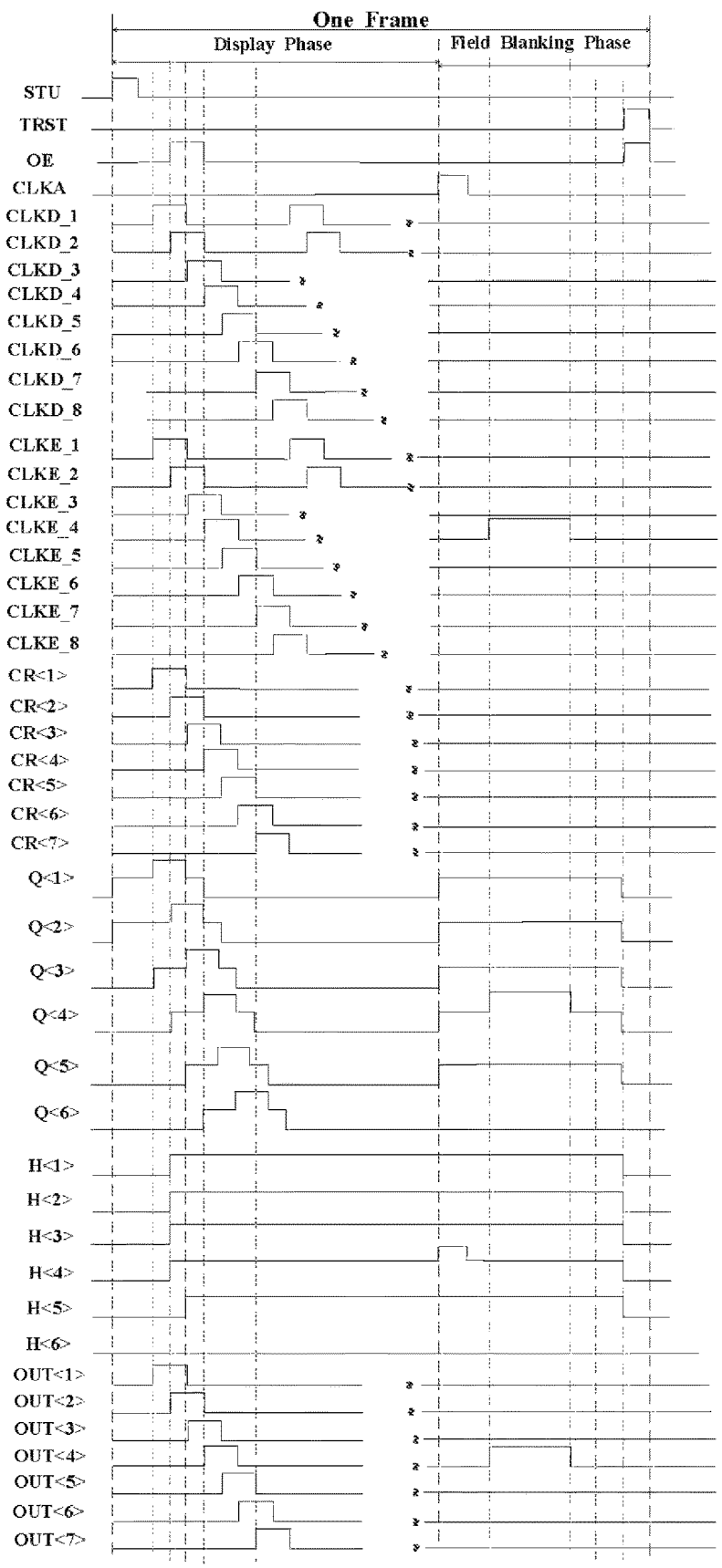
FIG. 7 is a timing diagram of control signals for a gate driving circuit according to an embodiment of the present disclosure.

FIG. 7 is a timing diagram of control signals for a gate driving circuit according to an embodiment of the present disclosure. FIG. 7 exemplarily illustrates that the fourth shift register unit A4 in the gate driving circuit outputs the gate driving signal in the first phase (for example, the display phase) and outputs the compensation driving signal in the second phase (for example, the field blanking phase).

In this working process, the carry control signal CR<2> output by the second shift register unit A2 is used as the first input signal $V_{IN}\_4$ of the fourth shift register unit A4, and the carry control signal CR<7> output by the seventh shift register unit A7 is used as the first reset signal $V_{RE}\_4$ of the fourth shift register unit A4. The working process of the fourth shift register unit A4 may be referring to the working process of the shift register unit described above with reference to FIG. 4, and details are not repeated herein.

FIG. 8 is a flowchart of a method for controlling a shift register unit according to an embodiment of the present disclosure. As illustrated in FIG. 8, the method may include steps S802 to S810.

In step S802, in the first phase, the first input sub-circuit changes the potential of the first node from the first level to the second level under control of the first input signal, and the second input sub-circuit changes the potential of the second node from the first level to the second level under control of the second input signal and maintains the potential of the second node at the second level until the second phase subsequent to the first phase.

In step S804, the first output sub-circuit changes the potential of the first node from the second level to the third level under control of the first clock signal so as to output the gate driving signal. The second level is between the first level and the third level.

In step S806, the first reset sub-circuit resets the potential of the first node to the first level under control of the first reset signal.

In step S808, in the second phase, the third input sub-circuit changes the potential of the first node after being reset from the first level to the second level under control of the third input signal.

In step S810, the first output sub-circuit changes the potential of the first node from the second level to the third level under control of the first clock signal so as to output the compensation driving signal.

So far, the method for controlling the shift register unit according to some embodiments of the present disclosure is provided. By using this method, the shift register unit can output the gate driving signal in the first phase (for example, the display phase), and output the compensation driving signal in the second phase (for example, the field blanking phase). Therefore, the method enables the shift register unit to achieve the function of outputting different signals in different phases without affecting the normal display of the display device.

In some embodiments, the method may further include: the third input sub-circuit changing the potential of the second node from the second level to the fourth level under control of the third input signal. The second level is between the first level and the fourth level.

In some embodiments, the method may further include: subsequent to the first output sub-circuit outputting the compensation driving signal, the second reset sub-circuit resetting the potential of the first node and the potential of the second node under control of the second reset signal.

In some embodiments of the present disclosure, a display device is further provided. The display device may include the gate driving circuit described above. For example, the display device may be any product or component with a display function, such as a display panel, a mobile phone, a tablet computer, a television, a display screen, a notebook computer, a digital photo frame, a navigator, or the like.

Figure 9:
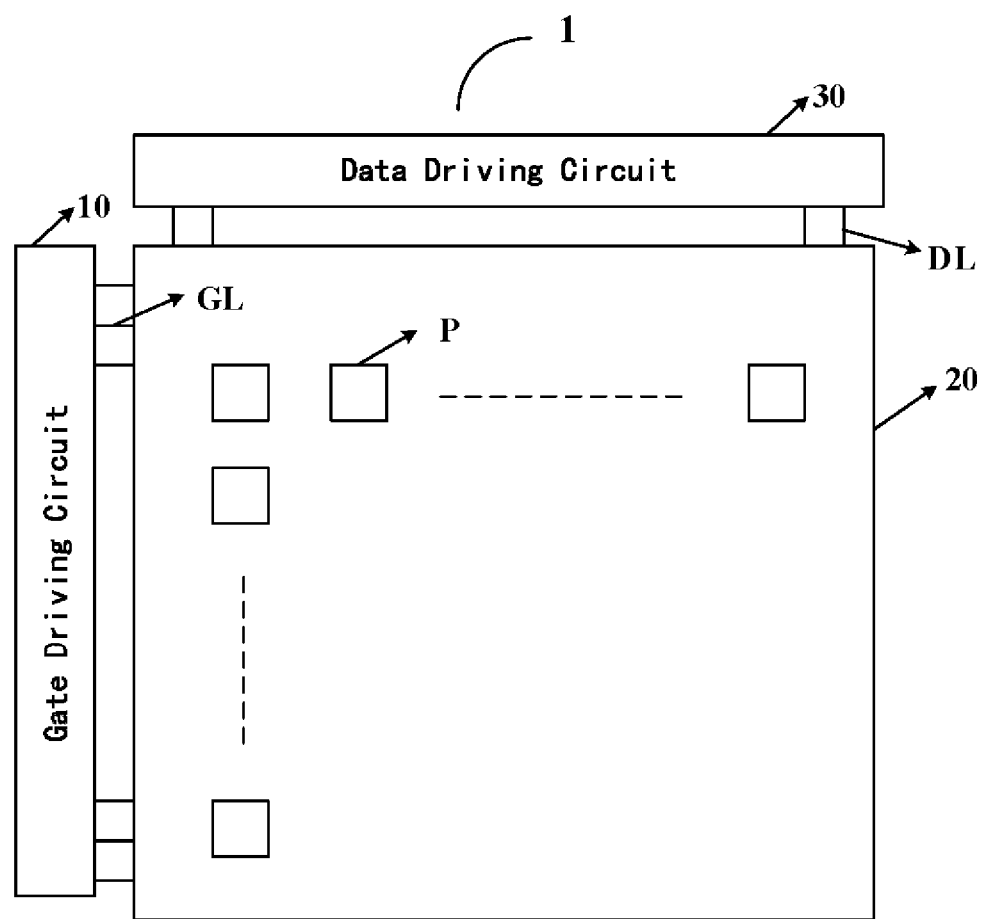
FIG. 9 is a structural diagram of a display device according to an embodiment of the present disclosure.

FIG. 9 is a structural diagram of a display device according to an embodiment of the present disclosure. As illustrated in FIG. 9, a display device 1 includes a gate driving circuit 10 (for example, the gate driving circuit illustrated in FIG. 6). The display device 1 further includes a display panel 20, and the display panel 20 includes a pixel array composed of a plurality of sub-pixel units P. For example, each sub-pixel unit P includes a pixel circuit and a light-emitting element, and the pixel circuit is, for example, a 3T1C pixel circuit including a driving transistor, a scanning transistor, a sensing transistor, and a storage capacitor. For example, the display device 1 may further include a data driving circuit 30. The data driving circuit 30 is used to provide data signals to the sub-pixel units P in the pixel array. The gate driving circuit 10 is used to provide gate driving signals to the sub-pixel units P in the pixel array in the first phase (for example, the display phase) and provide compensation driving signals to the sub-pixel units P in the pixel array in the second phase (for example, the field blanking phase). For example, the gate driving signal may drive the scanning transistor in the pixel circuit in the sub-pixel unit P, and the compensation driving signal may drive the sensing transistor in the pixel circuit in the sub-pixel unit P. The data driving circuit 30 is electrically connected to the sub-pixel unit P through a data line DL, and the gate driving circuit 10 is electrically connected to the sub-pixel unit P through a gate line GL.

The technical effects of the display device provided by the embodiments of the present disclosure may be with reference to the corresponding descriptions of the shift register unit and the gate driving circuit in the above-mentioned embodiments, and details are not repeated herein.

So far, various embodiments of the present disclosure have been described in detail. In order to avoid obscuring the concept of the present disclosure, some details known in the art are not described. Based on the above description, those skilled in the art can fully understand how to implement the technical solutions provided herein.

What have been described above merely are specific implementations of the present disclosure, but the protection scope of the present disclosure is not limited to this. The protection scope of the present disclosure is determined by the appended claims.

What is claimed is:

1. A shift register unit, comprising:
a first input sub-circuit, configured to change a potential of a first node from a first level to a second level under control of a first input signal in a first phase;
a first output sub-circuit, electrically connected to the first node and configured to output a gate driving signal after receiving a first clock signal in the first phase and output a compensation driving signal after receiving the first clock signal in a second phase subsequent to the first phase;
a first reset sub-circuit, electrically connected between the first node and a first voltage terminal for providing the first level and configured to reset the potential of the first node to the first level under control of a first reset signal;
a second input sub-circuit, electrically connected between the first node and the first voltage terminal and configured to change a potential of a second node from the first level to the second level under control of a second input signal in the first phase and maintain the potential of the second node at the second level until the second phase; and
a third input sub-circuit, electrically connected to the second node and configured to change the potential of the first node after being reset from the first level to the second level under control of a third input signal in the second phase.

2. The shift register unit according to claim 1, wherein the first output sub-circuit is configured to change the potential of the first node from the second level to a third level when outputting the gate driving signal in the first phase, and is configured to change the potential of the first node from the second level to the third level when outputting the compensation driving signal in the second phase, and the second level is between the first level and the third level; and
the third input sub-circuit is further configured to change the potential of the second node from the second level to a fourth level under control of the third input signal, and the second level is between the first level and the fourth level.

3. The shift register unit according to claim 2, wherein the second input sub-circuit comprises a first switching transistor and a first capacitor;
a first electrode of the first switching transistor is electrically connected to the first node, a second electrode of the first switching transistor is electrically connected to the second node, and a gate electrode of the first switching transistor is configured to receive the second input signal; and
a first terminal of the first capacitor is electrically connected to the second node, and a second terminal of the first capacitor is electrically connected to the first voltage terminal.

4. The shift register unit according to claim 1, wherein the second input sub-circuit comprises a first switching transistor and a first capacitor;
a first electrode of the first switching transistor is electrically connected to the first node, a second electrode of the first switching transistor is electrically connected to the second node, and a gate electrode of the first switching transistor is configured to receive the second input signal; and
a first terminal of the first capacitor is electrically connected to the second node, and a second terminal of the first capacitor is electrically connected to the first voltage terminal.

5. The shift register unit according to claim 1, wherein the third input sub-circuit comprises a second switching transistor and a third switching transistor; and
a first electrode of the second switching transistor is electrically connected to a gate electrode of the third switching transistor and is configured to receive the third input signal, a second electrode of the second switching transistors is electrically connected to a first electrode of the third switching transistor, a gate electrode of the second switching transistor is electrically connected to the second node, and a second electrode of the third switching transistor is electrically connected to the first node.

6. The shift register unit according to claim 1, wherein the first reset sub-circuit comprises a fourth switching transistor,
a first electrode of the fourth switching transistor is electrically connected to the first node, a second electrode of the fourth switching transistor is electrically connected to the first voltage terminal, and a gate electrode of the fourth switching transistor is configured to receive the first reset signal.

7. The shift register unit according to claim 1, further comprising:
a second reset sub-circuit, configured to reset the potential of the first node and the potential of the second node under control of a second reset signal.

8. The shift register unit according to claim 7, wherein the second reset sub-circuit comprises a fifth switching transistor,
a first electrode of the fifth switching transistor is electrically connected to the first node, a second electrode of the fifth switching transistor is electrically connected to the first voltage terminal, and a gate electrode of the fifth switching transistor is configured to receive the second reset signal.

9. The shift register unit according to claim 1, further comprising:
a second output sub-circuit, configured to output a carry control signal after receiving a second clock signal in the first phase.

10. The shift register unit according to claim 9, further comprising:
a noise reduction sub-circuit, configured to maintain the potential of the first node at the first level in a case where the potential of the first node is reset; and
a potential maintaining sub-circuit, configured to maintain a potential of an output terminal of the first output sub-circuit at a fifth level in the case where the potential of the first node is reset and maintain a potential of an output terminal of the second output sub-circuit at the first level.

11. The shift register unit according to claim 10, wherein the noise reduction sub-circuit comprises a sixth switching transistor, a seventh switching transistor, and an eighth switching transistor;
a first electrode of the sixth switching transistor and a gate electrode of the sixth switching transistor are both electrically connected to a second voltage terminal for providing the second level, and a second electrode of the sixth switching transistor is electrically connected to a third node;
a first electrode of the seventh switching transistor is electrically connected to the third node, a second electrode of the seventh switching transistor is electrically connected to the first voltage terminal, and a gate electrode of the seventh switching transistor is electrically connected to the first node; and a first electrode of the eighth switching transistor is electrically connected to the first node, a second electrode of the eighth switching transistor is electrically connected to the first voltage terminal, and a gate electrode of the eighth switching transistor is electrically connected to the third node.

12. The shift register unit according to claim 10, wherein the potential maintaining sub-circuit comprises a ninth switching transistor and a tenth switching transistor;
a first electrode of the ninth switching transistor is electrically connected to the output terminal of the second output sub-circuit, a second electrode of the ninth switching transistor is electrically connected to the first voltage terminal, and a gate electrode of the ninth switching transistor is electrically connected to a third node; and
a first electrode of the tenth switching transistor is electrically connected to the output terminal of the first output sub-circuit, a second electrode of the tenth switching transistor is electrically connected to a third voltage terminal for providing the fifth level, and a gate electrode of the tenth switching transistor is electrically connected to the third node.

13. The shift register unit according to claim 9, wherein the second output sub-circuit comprises a twelfth switching transistor; and
a first electrode of the twelfth switching transistor is configured to receive the second clock signal, a second electrode of the twelfth switching transistor is configured to serve as an output terminal of the second output sub-circuit, and a gate electrode of the twelfth switching transistor is electrically connected to the first node.

14. A gate driving circuit, comprising a plurality of shift register units according to claim 9.

15. The gate driving circuit according to claim 14, wherein the plurality of shift register units comprise N shift register units, and N is a positive integer;
among the N shift register units, a carry control signal output by an $(i-x_1)$-th shift register unit serves as a first input signal of an i-th shift register unit, and first input signals of a first shift register unit to an $x_1$-th shift register unit are first input signals output by an external circuit, respectively, $x_1+1 \leq i \leq N$, i is a positive integer, and $x_1$ is a positive integer; and
among the N shift register units, a carry control signal output by a $(j+x_2)$-th shift register unit serves as a first reset signal of a j-th shift register unit, first reset signals of an $(N-x_2+1)$-th shift register unit to an N-th shift register unit are first reset signals output by the external circuit, respectively, $1 \leq j \leq N-x_2$, j is a positive integer, and $x_2$ is a positive integer.

16. A display device, comprising the gate driving circuit according to claim 14.

17. The shift register unit according to claim 1, wherein the first output sub-circuit comprises an eleventh switching transistor and a second capacitor;
a first electrode of the eleventh switching transistor is configured to receive the first clock signal, a second electrode of the eleventh switching transistor is configured to serve as an output terminal of the first output sub-circuit, and a gate electrode of the eleventh switching transistor is electrically connected to the first node; and
a first terminal of the second capacitor is electrically connected to the gate electrode of the eleventh switching transistor, and a second terminal of the second capacitor is electrically connected to the second electrode of the eleventh switching transistor.

18. The shift register unit according to claim 1, wherein the first input sub-circuit comprises a thirteenth switching transistor; and
a first electrode of the thirteenth switching transistor is electrically connected to a fourth voltage terminal for providing the second level, a second electrode of the thirteenth switching transistor is electrically connected to the first node, and a gate electrode of the thirteenth switching transistor is configured to receive the first input signal.

19. The shift register unit according to claim 1, wherein the shift register unit further comprises a second reset sub-circuit, a second output sub-circuit, a noise reduction sub-circuit, and a potential maintaining sub-circuit;
the second input sub-circuit comprises a first switching transistor and a first capacitor, a first electrode of the first switching transistor is electrically connected to the first node, a second electrode of the first switching transistor is electrically connected to the second node, a gate electrode of the first switching transistor is configured to receive the second input signal, a first terminal of the first capacitor is electrically connected to the second node, and a second terminal of the first capacitor is electrically connected to the first voltage terminal;
the third input sub-circuit comprises a second switching transistor and a third switching transistor, a first electrode of the second switching transistor is electrically connected to a gate electrode of the third switching transistor and is configured to receive the third input signal, a second electrode of the second switching transistor is electrically connected to a first electrode of the third switching transistor, a gate electrode of the second switching transistor is electrically connected to the second node, and a second electrode of the third switching transistor is electrically connected to the first node;
the first reset sub-circuit comprises a fourth switching transistor, a first electrode of the fourth switching transistor is electrically connected to the first node, a second electrode of the fourth switching transistor is electrically connected to the first voltage terminal, and a gate electrode of the fourth switching transistor is configured to receive the first reset signal;
the second reset sub-circuit comprises a fifth switching transistor, a first electrode of the fifth switching transistor is electrically connected to the first node, a second electrode of the fifth switching transistor is electrically connected to the first voltage terminal, and a gate electrode of the fifth switching transistor is configured to receive a second reset signal;
the noise reduction sub-circuit comprises a sixth switching transistor, a seventh switching transistor, and an eighth switching transistor, a first electrode of the sixth switching transistor and a gate electrode of the sixth switching transistor are both electrically connected to a second voltage terminal for providing the second level, a second electrode of the sixth switching transistor is electrically connected to a third node, a first electrode of the seventh switching transistor is electrically connected to the third node, a second electrode of the seventh switching transistor is electrically connected to the first voltage terminal, a gate electrode of the seventh switching transistor is electrically connected to the first node, a first electrode of the eighth switching transistor is electrically connected to the first node, a second electrode of the eighth switching transistor is electrically connected to the first voltage terminal, and a gate electrode of the eighth switching transistor is electrically connected to the third node;

the potential maintaining sub-circuit comprises a ninth switching transistor and a tenth switching transistor, a first electrode of the ninth switching transistor is electrically connected to an output terminal of the second output sub-circuit, a second electrode of the ninth switching transistor is electrically connected to the first voltage terminal, a gate electrode of the ninth switching transistor is electrically connected to the third node, a first electrode of the tenth switching transistor is electrically connected to an output terminal of the first output sub-circuit, a second electrode of the tenth switching transistor is electrically connected to a third voltage terminal for providing a fifth level, and a gate electrode of the tenth switching transistor is electrically connected to the third node;

the first output sub-circuit comprises an eleventh switching transistor and a second capacitor, a first electrode of the eleventh switching transistor is configured to receive the first clock signal, a second electrode of the eleventh switching transistor is configured to serve as the output terminal of the first output sub-circuit, a gate electrode of the eleventh switching transistor is electrically connected to the first node, a first terminal of the second capacitor is electrically connected to the gate electrode of the eleventh switching transistor, and a second terminal of the second capacitor is electrically connected to the second electrode of the eleventh switching transistor;

the second output sub-circuit comprises a twelfth switching transistor, a first electrode of the twelfth switching transistor is configured to receive a second clock signal, a second electrode of the twelfth switching transistor is configured to serve as the output terminal of the second output sub-circuit, and a gate electrode of the twelfth switching transistor is electrically connected to the first node; and the first input sub-circuit comprises a thirteenth switching transistor, a first electrode of the thirteenth switching transistor is electrically connected to a fourth voltage terminal for providing the second level, a second electrode of the thirteenth switching transistor is electrically connected to the first node, and a gate electrode of the thirteenth switching transistor is configured to receive the first input signal.

20. A method for controlling a shift register unit, comprising:

in a first phase, a first input sub-circuit changing a potential of a first node from a first level to a second level under control of a first input signal, a second input sub-circuit changing a potential of a second node from the first level to the second level under control of a second input signal and maintaining the potential of the second node at the second level until a second phase subsequent to the first phase;

a first output sub-circuit changing the potential of the first node from the second level to a third level when outputting a gate driving signal after receiving a first clock signal, and the second level being between the first level and the third level;

a first reset sub-circuit resetting the potential of the first node to the first level under control of a first reset signal;

in the second phase, a third input sub-circuit changing the potential of the first node after being reset from the first level to the second level under control of a third input signal; and the first output sub-circuit changing the potential of the first node from the second level to the third level when outputting a compensation driving signal after receiving the first clock signal.

* * * * *

UNITED STATES PATENT AND TRADEMARK OFFICE
CERTIFICATE OF CORRECTION

| | |
|---|---|
| PATENT NO. | : 11,676,541 B2 |
| APPLICATION NO. | : 17/264050 |
| DATED | : June 13, 2023 |
| INVENTOR(S) | : Xuehuan Feng and Yongqian Li |

It is certified that error appears in the above-identified patent and that said Letters Patent is hereby corrected as shown below:

On the Title Page

Item (73) Second Assignee: BOE TECHNOLOGY GROUP Group GO., LTD.
Should be corrected to: BOE TECHNOLOGY GROUP CO., LTD.

Signed and Sealed this
Twenty-eighth Day of November, 2023

Katherine Kelly Vidal
*Director of the United States Patent and Trademark Office*